(12) United States Patent
Blödt (10) Patent No.: US 11,774,477 B2
(45) Date of Patent: Oct. 3, 2023

(54) MEASURING DEVICE FOR DETERMINING A DIELECTRIC CONSTANT COMPRISING AN ELECTRICALLY CONDUCTIVE ARRANGEMENT ELECTRICALLY CONTACTS TWO WAVEGUIDES WITH ONE ANOTHER

(71) Applicant: Endress+Hauser SE+Co. KG, Maulburg (DE)

(72) Inventor: Thomas Blödt, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 105 days.

(21) Appl. No.: 17/635,040

(22) PCT Filed: Jul. 10, 2020

(86) PCT No.: PCT/EP2020/069522
§ 371 (c)(1),
(2) Date: Feb. 14, 2022

(87) PCT Pub. No.: WO2021/028130
PCT Pub. Date: Feb. 18, 2021

(65) Prior Publication Data
US 2022/0283210 A1    Sep. 8, 2022

(30) Foreign Application Priority Data

Aug. 15, 2019 (DE) ...................... 10 2019 121 995.7

(51) Int. Cl.
*G01F 23/292* (2006.01)
*G01R 27/26* (2006.01)

(52) U.S. Cl.
CPC ....... *G01R 27/2682* (2013.01); *G01F 23/292* (2013.01)

(58) Field of Classification Search
CPC ........ G01F 23/292; G01F 23/22; G01F 23/28; G01N 22/00; G01R 27/26
(Continued)

(56) References Cited

U.S. PATENT DOCUMENTS

| 4,891,573 A | 1/1990 | Kent |
| 2012/0092674 A1 | 4/2012 | Enayati et al. |
| 2015/0168202 A1* | 6/2015 | Blodt ................... G01F 23/296 73/290 V |

FOREIGN PATENT DOCUMENTS

| DE | 7734379 U1 | 5/1978 |
| DE | 29721039 U1 | 2/1998 |

(Continued)

*Primary Examiner* — Que Tan Le
(74) *Attorney, Agent, or Firm* — Mark A. Logan; Endress+Hauser (USA) Holding, Inc.

(57) ABSTRACT

The invention relates to a measuring device for determining the dielectric value of a medium. The measuring device is based on two waveguides, each of which has a signal gate on one end. The waveguides are, in such case, so arranged that the signal gates lie opposite one another. Formed therebetween is a sample space for the medium, such that a high frequency signal, which is in-coupled into the first waveguide, is transmitted into the second waveguide via the second signal gate after passage through the medium. Since the transmitted fraction and the reflected fraction of the high frequency signal depend strongly on the dielectric value, such can, as a result, be measured with a high sensitivity and, depending on choice of the frequency band and dimensioning of the waveguides, over a large value range.

16 Claims, 3 Drawing Sheets

(58) Field of Classification Search
USPC .......................................... 250/577, 573, 221
See application file for complete search history.

(56) References Cited

FOREIGN PATENT DOCUMENTS

| | | |
|---|---|---|
| DE | 102004017581 A1 | 11/2005 |
| DE | 102015117205 A1 | 4/2017 |
| EP | 0622628 A2 | 11/1994 |
| EP | 0919805 A1 | 6/1999 |
| EP | 1116951 A1 | 7/2001 |

* cited by examiner

MEASURING DEVICE FOR DETERMINING A DIELECTRIC CONSTANT COMPRISING AN ELECTRICALLY CONDUCTIVE ARRANGEMENT ELECTRICALLY CONTACTS TWO WAVEGUIDES WITH ONE ANOTHER

CROSS-REFERENCE TO RELATED APPLICATIONS

The present application is related to and claims the priority benefit of German Patent Application No. 10 2019 121 995.7, filed on Aug. 15, 2019 and International Patent Application No. PCT/EP2020/069522, filed on Jul. 10, 2020, the entire contents of which are incorporated herein by reference.

TECHNICAL FIELD

The invention relates to a measuring device for determining a dielectric value of a fill substance as well as to a corresponding method for operating the measuring device.

BACKGROUND

In automation technology, especially in process automation technology, field devices are often applied, which serve for registering and/or for influencing process variables. Applied for registering process variables are sensors, which are used, for example, in fill level measuring devices, flow measuring devices, pressure- and temperature measuring devices, pH-redox potential measuring devices, conductivity measuring devices, etc. These register the corresponding process variables, fill level, flow, pressure, temperature, pH value, redox potential, conductivity or the dielectric value. A large number of these field devices are produced and sold by the firm, Endress+Hauser.

The determination of dielectric value (also known as "dielectric constant" or "relative permittivity") of fill substances in containers is of great interest both in the case of solid, as well as also in the case of liquid, fill substances, such as, for example, fuels, waste waters or chemicals, since this value can be a reliable indicator of impurities, moisture content or substance composition. In such case, understood as "containers" within the scope of the invention are also open containments, such as, for example, vats, lakes or oceans or flowing bodies of water.

It is known to determine the dielectric value, above all, in the case of liquid fill substances, using the capacitive measuring principle. In such case, the effect is utilized that the capacitance of a capacitor changes proportionally with the dielectric value of the medium located between the two electrodes of the capacitor. In the case of this measuring principle, measuring of the dielectric value occurs at rather small frequencies of some kHz into the MHz range.

Alternatively, it is also possible to co-determine the dielectric value of a (liquid) medium in a container interior virtually parasitically in the case of a radar-based fill level measurement of the medium. This requires the measuring principle of guided radar, in the case of which microwaves are led in the medium via an electrically conductive waveguide. This combined fill level- and dielectric measuring is described in disclosure document DE 10 2015 117 205 A1.

Another method based on the principle of guided radar is described in the publication EP 0622 628 A2. Measuring devices, which work according to this measuring principle, are sold in numerous forms of embodiment by the firm, IMKO Mikromodultechnik GmbH.

Measuring devices using the above described methods are, as a rule, intended for performing calibrations. This means an extra effort in the production, or at start-up on-site. Furthermore, these measuring methods require circuit-wise, as a rule, a complex hardware, in order that the dielectric value can be determined with high resolution, or over a broad measuring range. With increasing operating time, additionally, a cyclic re-calibration can be necessary. Also, a worsening of the accuracy of measuring a total system can burden the above described measuring methods.

SUMMARY

An object of the invention, therefore, is to provide a measuring device, which overcomes these disadvantages.

The invention achieves this object by a measuring device for determining the dielectric value of a medium, comprising components as follows:
  a signal production unit, which is designed to produce an electrical, high frequency signal having a frequency varying within a frequency band,
  a first waveguide having
    an in-coupling element, which is designed to couple the produced high frequency signal into the first waveguide, and
    a first end region, which is designed for reflecting the high frequency signal,
    arranged lying opposite the first end region, a first signal gate, via which the high frequency signal can be out-coupled into the medium,
  a second waveguide having
    a second end region, which is designed for reflecting the high frequency signal,
    arranged lying opposite the second end region, a second signal gate, wherein the second signal gate is designed and arranged lying opposite the first signal gate in such a manner that the high frequency signal is in-coupleable into the second waveguide via the second signal gate after passage through the medium, and
    an out-coupling element, which is designed to out-couple the high frequency signal from the second waveguide,
  an electrically conductive arrangement, which electrically contacts the two waveguides with one another, and
  connected at least to the out-coupling element, a signal evaluation unit, which is designed
    to receive within the frequency band the frequency-dependent, reflected fraction of the high frequency signal in-coupled into the first waveguide and/or the frequency-dependent, transmitted fraction of the high frequency signal in-coupled into the first waveguide,
    to ascertain, based on the reflected fraction, a frequency-dependent, reflection minimum and the corresponding frequency, and/or to ascertain, based on the transmitted fraction, a frequency-dependent, transmitted maximum and the corresponding frequency,
    to determine, based on the frequency of the reflection minimum or based on the frequency of the transmitted maximum, the real part of the dielectric value, and/or to determine, based on the transmitted fraction at the frequency of the reflection minimum, the imaginary part of the dielectric value, and/or to determine, based on the imaginary part and the real part, the magnitude of the dielectric value.

By this construction, the measuring device of the invention utilizes the effect that, as a function of the dielectric value of the fill substance and frequency of the high frequency signal, a standing wave of the high frequency signal forms in, and between, the waveguides. In this way, the transmitted fraction and the reflected fraction depend greatly on the frequency and the dielectric value, such that the dielectric value can be measured with a high sensitivity and, depending on choice of the frequency band and dimensioning of the waveguide, over a large value range. The measuring device of the invention offers, moreover, the advantage that the signal evaluation unit can be implemented by means of a widely used and, consequently, cost effective, network analyzer chip.

In such case, the term "unit" means in the context of the invention, in principle, any electronic circuit, which is suitably designed for the contemplated application. It can, thus, depending on requirement, be an analog circuit for producing, or processing, corresponding analog signals. It can also be a digital circuit, such as an FPGA or a storage medium in cooperation with a program. In such case, the program is designed to perform the corresponding method steps, or to apply the needed calculational operations of a unit. In this context, different electronic units of the fill level measuring device can, within the scope of the invention, potentially also use a shared physical memory and/or be operated by means of the same physical, digital circuit.

The forming of a standing wave in the waveguides can be favored, when the first waveguide and the in-coupling element are designed in such a manner that the first waveguide has a higher impedance than the in-coupling element, and when the second waveguide and the out-coupling element are designed in such a manner that the second waveguide has a higher impedance than the out-coupling element. In this connection, it is especially advantageous that the first waveguide and the in-coupling element be designed in such a manner that the impedance of the first waveguide is at least 40%, especially at least 20 ohm, higher than that of the in-coupling element, and that the second waveguide and the out-coupling element be designed in such a manner that the impedance of the second waveguide is at least 40%, especially at least 20 ohm, higher than that of the out-coupling element.

Power consumption of the measuring device can be optimized by designing the electrically conductive arrangement between the two waveguides to be a reflector for the high frequency signal, such that the coupling intensity of the high frequency signal between the signal gates is increased. At the same time, this potentially improves the signal to noise ratio and increases the resolution of the dielectric value measuring. In such case, the reflector can be designed, for example, as an arrangement of metal, or metallized, plates, wherein the form and orientation of reflector plates are preferably adapted to the cross sectional shape of the waveguides, thus, for example, a circular or rectangular shape.

The number of reflector plates can be reduced to one, when the first waveguide and/or the second waveguide at the first signal gate and/or at the second signal gate is/are bent in such a manner, especially by 90°, that the reflector is positioned, for instance, in the focus of the bend or bends, as the case may be. In such case, it is additionally advantageous that the form of the bend, or bends, as the case may be, is/are approximately parabolic for the focusing. In this way, the reflector area can, in turn, be reduced. By reducing the number of reflectors, moreover, the access to the sample space for the medium to be measured between the waveguides is simplified.

The forming of the high frequency signal is favored by dimensioning the first waveguide and the second waveguide and arranging the signal gates with a defined separation from one another in such a manner that the signal-path length of the high frequency signal between the two end regions is, for instance, half of that wavelength in air, or vacuum, which corresponds to the upper limit frequency of the frequency band, or to a whole numbered multiple of such wavelength, for instance, the two- or three times.

In this connection, it is, moreover, advantageous, when the in-coupling element is arranged at most at a separation from the first end region corresponding, for instance, to five fourths of that wavelength in air, or vacuum, which corresponds to the upper limit frequency of the frequency band, or when the out-coupling element is arranged at most at a separation from the second end region corresponding to five fourths of that wavelength in air, or vacuum, which corresponds to the upper limit frequency of the frequency band. In this way, the sensitivity of the dielectric constant measuring can be increased.

In the context of the invention, the type of waveguide is not prescribed. For example, the first waveguide and/or the second waveguide can be hollow conductors. In such case, it is, in the context of the invention, in principle, not fixedly prescribed, whether the waveguides have, for example, a circularly round or a rectangular cross section. A rectangular cross section is, however, advantageous, in that the waveguide is easier to produce, and in that the mode, in which the high frequency signal propagates in the waveguides, can be set more individually. Advantageous in this connection is the H10 mode. When the waveguides are designed as hollow conductors, at least one of them, preferably both, can, additionally, be filled with a dielectric ceramic-, glass- or plastic filling, especially HDPE, PP or PTFE, instead of air or vacuum. This offers, on the one hand, the advantage that the waveguide, as a whole, can be dimensioned more compactly. Additionally, in this case, the signal gates, which prevent a penetration of the medium into the waveguide, do not need to be separately implemented. Rather, they are, in this case, directly formed by the blocking plastic filling. For the case, in which the hollow conductor is not completely filled with a plastic, it is, in turn, an option, to produce the signal gates from one of the above mentioned plastics or a glass.

When the electrical, high frequency signal is formed within a frequency band from 1 GHz to 10 GHz, especially within 2 GHz to 6 GHz, or the waveguides and the in-coupling element as well as the out-coupling element are adapted with reference to such, the signal production unit can be implemented as a network analyzer chip.

Analogously to the measuring device of the invention, the object of the invention is also achieved by a method for determining the dielectric value by means of the measuring device according to one of the above described embodiments. Such method includes method steps as follows:

producing an electrical, high frequency signal by means of the signal production unit, in-coupling the high frequency signal via the in-coupling element into the first waveguide, out-coupling the high frequency signal from the second waveguide by means of the out-coupling element after passage through the medium, recording the frequency-dependent, reflected fraction and frequency-dependent, transmitted fraction of the in-coupled high frequency signal, ascertaining a frequency-dependent, reflection minimum and the corresponding frequency of the high frequency signal, and/or ascertaining a frequency-dependent, transmitted maximum and the corresponding frequency of the high frequency signal, determining the real part of the dielectric value based on the frequency of the reflection minimum or based on the frequency of the transmitted maximum, and/or determining the imaginary part of the dielectric value based on the transmitted fraction at the frequency of the reflection minimum or at the frequency of the transmitted maximum.

Then, based on the imaginary part and the real part, the magnitude of the dielectric value can be ascertained according to the formula:

$$DK = \sqrt{\text{Re}_{DK}^2 + \text{Im}_{DK}^2}$$

In an additional development of the method of the invention, supplementally, a phase shift of the high frequency signal between the in-coupling element and the out-coupling element can be ascertained. The measuring of the phase shift represents another opportunity for determining the real part of the dielectric value of the medium.

An additional development of the method of the invention can be achieved by ascertaining a quality of the measuring device based on the reflection minimum, especially based on the reflected fraction at the site of the reflection minimum, based on a breadth and/or based on an edge steepness of the reflection minimum. Based on the quality, in turn, the operating condition of the measuring device can be deduced. A lessened quality can, for example, be an indication of accretion formation between the waveguides or the failure of electronic components of the field device. By recording quality versus number of measuring cycles, additionally, a prediction can be made concerning when the quality will subceed a predefined minimum value, such that, based thereon, a timely maintenance of the measuring device can be initiated. Such procedure is also known as "predictive maintenance".

BRIEF DESCRIPTION OF THE DRAWINGS

The invention will now be explained in greater detail based on the appended drawing, the figures of which show as follows.

DETAILED DESCRIPTION

Figure 1:
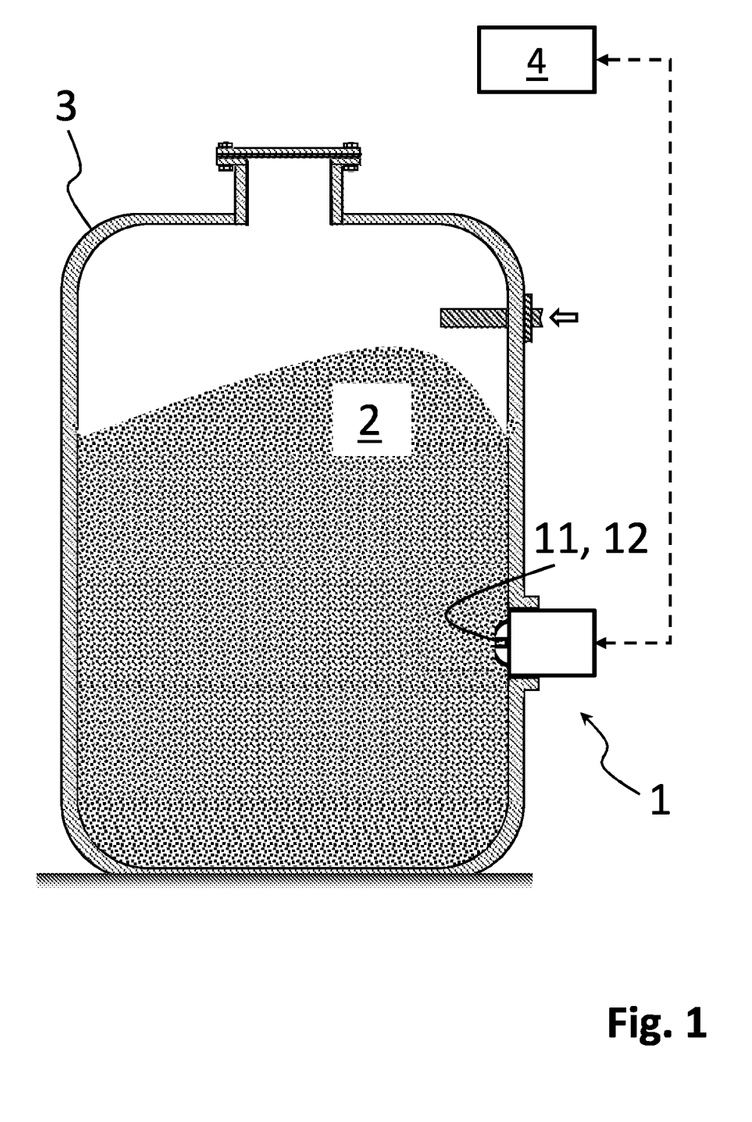
FIG. 1 shows a measuring device of the invention for dielectric value measurement of a medium in a container.

For providing a general understanding of the dielectric value measuring device 1 of the invention, FIG. 1 shows a schematic arrangement of the measuring device 1 on a container 3 containing a medium 2. In order to determine the dielectric value DK of the medium 2, the measuring device 1 is arranged laterally at a port of the container 3, for example, a flanged port. For this, the measuring device 1 is mounted, for instance, flushly with the container inner wall, wherein two waveguides 11, 12 of the measuring device 1 protrude partially into the container 3, such that medium 2 can get between the waveguides 11, 12. The medium 2 can be liquids, such as drinks, paints, cement or fuels, such as liquified gases or mineral oils. Another option is, however, also the application of the measuring device 1 for measuring bulk good media 2, such as, for example, a cereal grain.

The measuring device 1 can be connected to a superordinated unit 4, for example, a process control system. Implemented as interface can be, for instance, a "PROFIBUS", "HART", "wireless HART" or "Ethernet" interface. In this way, the dielectric value DK can be transmitted as a magnitude, or as a complex value with real part and imaginary part. However, also other information concerning general operating condition of the measuring device 1 can be communicated.

Figure 2:
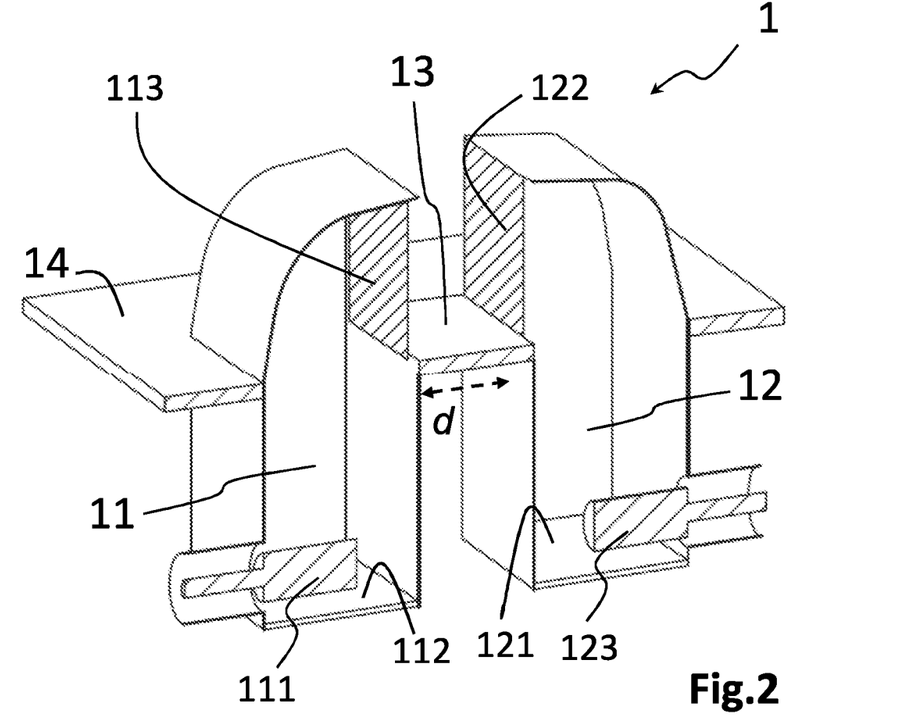
FIG. 2 shows a detail view of the measuring device.

The structural construction of the measuring device 1 of the invention is shown in detail in FIG. 2. Fundamentally, the measuring device 1 is based on two waveguides 11, 12, each of which has a signal gate 113, 122 on one of its ends. In such case, the waveguides 11, 12 are so arranged that the two signal gates 113, 122 are situated opposite one another with a defined separation d. Formed between the signal gates 113, 122 is, thus, the sample space for the medium 2, whose dielectric value DK is to be determined.

In the case of the embodiment shown in FIG. 2, the waveguides 11, 12 are designed as hollow conductors of rectangular cross section. In such case, a high frequency signal $s_{HF}$ is in-coupled laterally into the first waveguide 11 via an in-coupling element 111. The signal gates 113, 122 are designed to be transparent for the high frequency signal $s_{HF}$. Additionally, the two waveguides 11, 12 are electrically contacted with one another via an electrically conductive reflector 13. When the hollow conductors 11, 12 are filled with a plastic filling, especially HDPE, PP or PTFE, the signal gates 113, 122, in this case, need no longer be separately implemented, since the plastic fillings prevent a penetration of the medium 2 into the waveguides 11, 12 and at the same time assure an effective out-, and in-coupling of the high frequency signal $s_{HF}$.

Because of the above described design of the two waveguides 11, 12, the high frequency signal $s_{HF}$ is according to the invention out-coupled from the first signal gate 113 of the first waveguide 11 into the sample space, then led through the medium 2 (not shown in FIG. 2) and then in-coupled via the second signal gate 122 into the second waveguide 12. Analogously to in-coupling element 111, there is arranged laterally on the second waveguide 12 an out-coupling element 123, via which the transmitted fraction of the high frequency signal $s_{HF}$ can be out-coupled.

In the case of the example of an embodiment of the measuring device 1 shown in FIG. 2, following their signal gates 113, 122, the two waveguides 11, 12 undergo 90° bends. In such case, the form of the bends is approximately parabolic, such that the reflector 13 lies, for instance, at the focal point of the parabolas. Thus, the reflector 13 not only electrically contacts the waveguides 11, 12 with one another. Because of the reflection of the high frequency signal $s_{HF}$, moreover, the transmission $T_{HF}$ of the high frequency signal $s_{HF}$ between the signal gates 113, 122 is increased. As shown in FIG. 2, the reflector 13 lies, in the form of embodiment shown there, in a plane with a corresponding wall 14 of the measuring device 1, which separates the interior of the container 3 in the installed state from the container exterior and from the interior of the measuring device 1.

On the opposite end from the signal gates 113, 122, the waveguides 11, 12 have end regions 112, 121, which reflect the high frequency signal $s_{HF}$. For this, the end regions 111, 121 can be designed analogously to the reflector 13, for example, as metallized walls. Additionally, the length L of the two waveguides 11, 12 (in each case, starting from the end region 112, 121 and extending to the signal gate 113, 122) in total plus the separation d between the signal gates 113, 122 is ideally half the wavelength $\lambda_{HF}$ of the high frequency signal $s_{HF}$, or a whole numbered multiple thereof (in this connection, it is not necessary that the two waveguides 11, 12 be the same length). In this way, the high frequency signal $s_{HF}$ forms a standing wave between the end regions 112, 121 as a function of frequency $f_{HF}$ of the high frequency signal $s_{HF}$ and as a function of the dielectric value DK of the medium 2. This effect is reinforced, when the in-coupling element 111 and the out-coupling element 123, such as shown in FIG. 2 is, are arranged as near as possible (optimumly at a separation of maximum five fourths of the wavelength $\lambda_{HF}$ of the high frequency signal $s_{HF}$) to a reflecting end region 112, 121.

Figure 3:
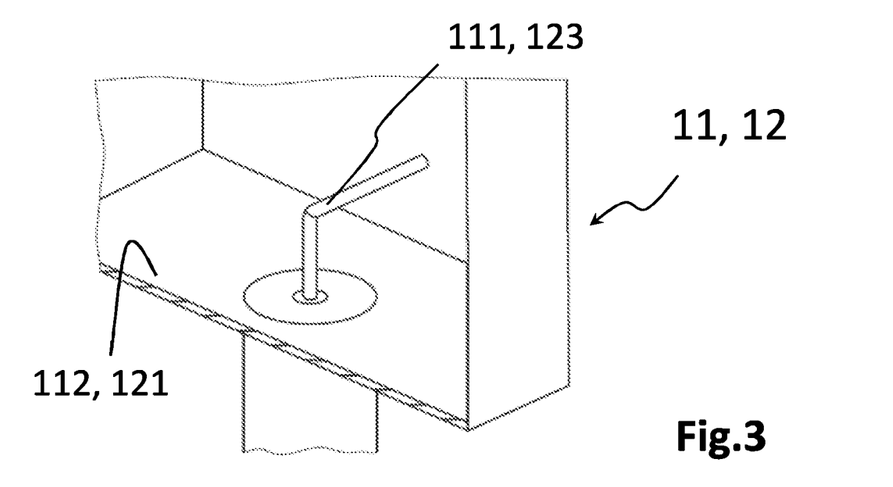
FIG. 3 shows a detail view of an in-coupling element or out-coupling element of the measuring device.

In order that the in-coupling element 111 and the out-coupling element 123 be arranged as near as possible to an end region, these can, such as shown in FIG. 3, also be arranged at the end region 112, 121 of a waveguide 11, 12, in contrast to a lateral arrangement. In such case, the elements 111, 123 are bent at 90°, in order that the high frequency signal $s_{HF}$ is, in turn, transmitted in the direction of the first waveguide 11, or received from the direction of the second waveguide 12.

Independently of the arrangement of the in-coupling element 111 and the out-coupling element 123, the waveguides 11, 12 and the in/out-coupling elements 111, 123 are advantageously designed in such a manner that the waveguides 11, 12 have a higher impedance than the in-coupling element 111, and the out-coupling element 123. Advantageously, the impedance difference amounts, in such case, to at least 40%, or 20 ohm. In such case, the in-coupling element 111 and the out-coupling element 123 can, such as shown in FIGS. 2 and 3, be designed as pins, wherein their length is matched to the frequency range $f_1$-$f_2$ of the high frequency signal $s_{HF}$. In reference to the reflector 13, it is, in such case, important so to orient the pins that the E field of the high frequency signal $s_{HF}$ extends, in accordance with the H10 mode, orthogonally to the surface of the reflector 13, such as is the case for the example of an embodiment in FIG. 2. In principle, it is, alternatively, however, also an option, so to arrange the pins 11, 123, or so to construct the waveguides 11, 12, that the high frequency signal $s_{HF}$ propagates, for example, in the TE31 mode or the H20 mode.

Because of the above described construction of the measuring device 1, it is according to the invention, effected, in total, that the absorption fraction $A_{HF}$ and the reflected fraction $R_{HF}$ (and therewith also the transmitted fraction $T_{HF}$) of the high frequency signal $s_{HF}$ between the in-coupling element 111 and the out-coupling element 123 depend greatly on the frequency $f_{HF}$ of the high frequency signal $s_{HF}$. In such case, the following formula holds generally for the power of the high frequency signal $s_{HF}$ in-coupled at the in-coupling element 111 relative to the transmitted power at the out-coupling element 123:

$$T_{HF}+A_{HF}+R_{HF}=0 \text{ dB or } 100\%$$

Figure 4:
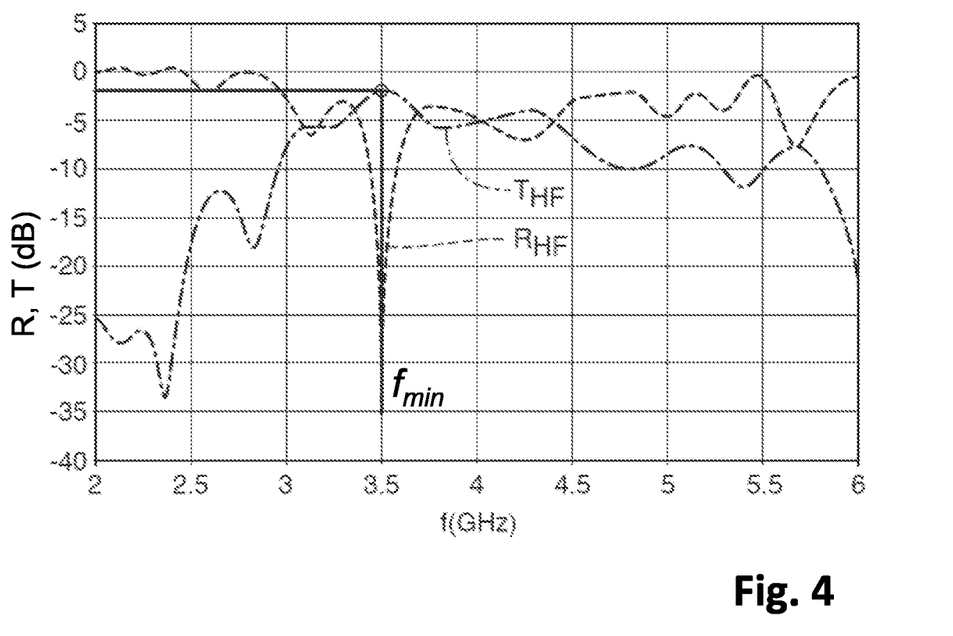
FIG. 4 shows a graph of frequency-dependent, transmitted fraction and frequency-dependent, reflected fraction in the measuring device.

The graph of FIG. 4 shows the frequency-dependent transmission/reflection of the high frequency signal $s_{HF}$. Thus, FIG. 4 shows the transmitted fraction $T_{HF}$ and the reflected fraction $R_{HF}$ of the high frequency signal $s_{HF}$ between the in-coupling element 111 and the out-coupling element 123 as a function of frequency $f_{HF}$. In such case, the frequency band $f_2$-$f_1$ of the high frequency signal $s_{HF}$ extends in the illustrated case between 2 GHz and 6 GHz. The graph shows that the medium 2 brings about a minimum especially in the case of the reflected fraction $R_{HF}$, wherein the frequency $f_{min}$ of the reflection minimum is proportional to the real part of the dielectric value DK of the medium 2. Thus, a correspondingly designed signal evaluation unit can after registering the frequency dependent reflected fraction $R_{HF}$ register the reflection minimum and based on the corresponding frequency $f_{min}$, in turn, calculate the real part $Re_{DK}$ of the dielectric value DK of the medium 2. The signal evaluation unit can, in turn, determine the imaginary part $Im_{DK}$ based on the transmitted fraction $T_{HF}$ at the frequency $f_{min}$ of the reflection minimum.

Then, based on $$DK=\sqrt{Re_{DK}^2+Im_{DK}^2}$$

the magnitude of the dielectric value DK of the medium can 2 be calculated. Alternatively to determining the dielectric value DK based on the reflection minimum, it is likewise possible to ascertain the global transmitted maximum corresponding to the reflection minimum, such as can be seen in the graph of FIG. 4. In such case, the signal evaluation unit can ascertain the real part $Re_{DK}$ of the dielectric value DK of the medium 2 based on the frequency of the transmitted maximum. The imaginary part $Im_{DK}$ can, in turn, be determined based on the transmitted fraction $T_{HF}$ at the frequency of the transmitted maximum. For registering the transmitted fraction $T_{HF}$ and the reflected fraction $R_{HF}$ as well as for ascertaining $Im_{DK}$, $Re_{DK}$ and DK, the signal evaluation unit can, for example, operate based on a network analyzer chip, which is connected correspondingly with the out-coupling element 123 and the in-coupling element 111.

The production of the high frequency signal $s_{HF}$ at the in-coupling element 111 can be accomplished by means of a corresponding signal production unit. The signal production unit can be, for example, a voltage controlled oscillator, whose frequency $f_{HF}$ is so controlled by means of a phase control loop ("phase locked loop") that the signal production unit produces the high frequency signal $s_{HF}$ within the desired frequency band $f_1$-$f_2$, for example, with a sawtooth-shaped frequency change. Also this function can be performed by a possibly present network analyzer chip, depending on its design.

The invention claimed is:

1. A measuring device for determining a dielectric value of a medium, comprising:
   a signal production unit designed to produce an electrical, high frequency signal having a frequency varying within a frequency band;
   a first waveguide having an in-coupling element designed to couple the produced high frequency signal into the first waveguide, a first end region designed for reflecting the high frequency signal, and a first signal gate arranged lying opposite the first end region via which the high frequency signal can be out-coupled into the medium;
   a second waveguide having a second end region is designed for reflecting the high frequency signal, a second signal gate arranged lying opposite the second end region and arranged lying opposite the first signal gate such that the high frequency signal is in-coupleable into the second waveguide via the second signal gate after passage through the medium, and an out-coupling element designed to out-couple the high frequency signal from the second waveguide;

an electrically conductive arrangement that electrically contacts the two waveguides with one another; and a signal evaluation unit connected at least to the out-coupling element, wherein the signal evaluation unit is configured:

to receive within the frequency band a frequency-dependent, reflected fraction of the high frequency signal in-coupled into the first waveguide and/or a frequency-dependent, transmitted fraction of the high frequency signal in-coupled into the first waveguide, to ascertain, based on the reflected fraction, a frequency-dependent, reflection minimum and a corresponding frequency, and/or to ascertain, based on the transmitted fraction, a frequency-dependent, transmitted maximum and a corresponding frequency, to determine, based on the corresponding frequency of the reflection minimum or based on the corresponding frequency of the transmitted maximum, a real part of the dielectric value, to determine, based on the transmitted fraction at the corresponding frequency of the reflection minimum, an imaginary part of the dielectric value, and to determine, based on the imaginary part of the dielectric value and the real part of the dielectric value, a magnitude of the dielectric value.

2. The measuring device as claimed in claim 1, wherein the first waveguide has a higher impedance than the in-coupling element, and wherein the second waveguide has a higher impedance than the out-coupling element.

3. The measuring device as claimed in claim 2, wherein the impedance of the first waveguide is at least 40% higher than that of the in-coupling element, and wherein the impedance of the second waveguide is at least 40% higher than that of the out-coupling element.

4. The measuring device as claimed in claim 1, wherein the electrically conductive arrangement is designed to be a reflector for the high frequency signal between the two signal gates such that the coupling intensity of the high frequency signal between the signal gates is increased.

5. The measuring device as claimed in claim 4, wherein the first waveguide and/or the second waveguide at the first signal gate and/or at the second signal gate is/are bent in such a manner that the reflector is positioned in the focus of the bend or bends.

6. The measuring device as claimed in claim 5, wherein the form of the bend, or bends, is/are parabolic for the focusing.

7. The measuring device as claimed in claim 1, wherein the first waveguide and the second waveguide are dimensioned in such a manner and the signal gates are arranged with a defined separation from one another in such a manner that the signal-path length of the high frequency signal between the two end regions is half of a wavelength in air, or vacuum, of an upper limit frequency of the frequency band, or to a whole numbered multiple of such wavelength.

8. The measuring device as claimed in claim 7, wherein the in-coupling element is arranged at most at a separation from the first end region corresponding to five fourths of the wavelength in air, or vacuum, of the upper limit frequency of the frequency band, and/or wherein the out-coupling element is arranged at most at a separation from the second end region corresponding to five fourths of the wavelength in air, or vacuum, of the upper limit frequency of the frequency band.

9. The measuring device as claimed in claim 1, wherein the first waveguide and/or the second waveguide is/are hollow conductors.

10. The measuring device as claimed in claim 9, wherein at least one of the hollow conductors is filled with a plastic filling.

11. The measuring device as claimed in claim 1, wherein the frequency band is from 1 GHz to 10 GHz.

12. The measuring device as claimed in claim 1, wherein the signal evaluation unit includes a network analyzer chip for determining the frequency-dependent, reflected fraction and/or the frequency-dependent, transmitted fraction, and/or wherein the network analyzer chip as signal production unit produces the electrical, high frequency signal.

13. A method for determining a dielectric value of a medium via a measuring device, the method comprising:

providing the measuring device, including:

a signal production unit designed to produce an electrical, high frequency signal having a frequency varying within a frequency band;

a first waveguide having an in-coupling element designed to couple the produced high frequency signal into the first waveguide, a first end region designed for reflecting the high frequency signal, and a first signal gate arranged lying opposite the first end region via which the high frequency signal can be out-coupled into the medium;

a second waveguide having a second end region is designed for reflecting the high frequency signal, a second signal gate arranged lying opposite the second end region and arranged lying opposite the first signal gate such that the high frequency signal is in-coupleable into the second waveguide via the second signal gate after passage through the medium, and an out-coupling element designed to out-couple the high frequency signal from the second waveguide;

an electrically conductive arrangement that electrically contacts the two waveguides with one another; and a signal evaluation unit connected at least to the out-coupling element, wherein the signal evaluation unit is configured:

to receive within the frequency band a frequency-dependent, reflected fraction of the high frequency signal in-coupled into the first waveguide and/or a frequency-dependent, transmitted fraction of the high frequency signal in-coupled into the first waveguide, to ascertain, based on the reflected fraction, a frequency-dependent, reflection minimum and a corresponding frequency, and/or to ascertain, based on the transmitted fraction, a frequency-dependent, transmitted maximum and a corresponding frequency, to determine, based on the corresponding frequency of the reflection minimum or based on the corresponding frequency of the transmitted maximum, a real part of the dielectric value, to determine, based on the transmitted fraction at the corresponding frequency of the reflection minimum, an imaginary part of the dielectric value, and to determine, based on the imaginary part of the dielectric value and the real part of the dielectric value, a magnitude of the dielectric value;

producing the electrical, high frequency signal via the signal production unit;

in-coupling the high frequency signal via the in-coupling element into the first waveguide;

out-coupling the high frequency signal from the second waveguide via the out-coupling element after passage through the medium;

recording the frequency-dependent, reflected fraction and the frequency-dependent, transmitted fraction of the in-coupled high frequency signal;

ascertaining the frequency-dependent, reflection minimum and the corresponding frequency of the high frequency signal, and/or ascertaining the frequency-dependent, transmitted maximum and the corresponding frequency of the high frequency signal;

determining the real part of the dielectric value based on the frequency of the reflection minimum or based on the frequency of the transmitted maximum; and determining the imaginary part of the dielectric value based on the transmitted fraction at the frequency of the reflection minimum or at the frequency of the transmitted maximum.

14. The method as claimed in claim 13, further comprising:

ascertaining the magnitude of the dielectric value based on the imaginary part and based on the real part.

15. The method as claimed in claim 14, further comprising:

ascertaining a phase shift of the high frequency signal between the in-coupling element and the out-coupling element.

16. The method as claimed in claim 15, further comprising:

ascertaining a quality of the measuring device based on the reflected fraction at the site of the reflection minimum or based on a breadth and/or an edge steepness of the reflection minimum.

* * * * *